United States Patent
Tran et al.

(10) Patent No.: US 9,324,668 B2
(45) Date of Patent: *Apr. 26, 2016

(54) BONDING STRUCTURES AND METHODS OF FORMING THE SAME

(71) Applicant: Taiwan Semiconductor Manufacturing Company, Ltd., Hsin-Chu (TW)

(72) Inventors: Luan C. Tran, Tainan (TW); Yeur-Luen Tu, Taichung (TW); Ching-Chun Wang, Tainan (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/800,249

(22) Filed: Jul. 15, 2015

(65) Prior Publication Data

US 2015/0318250 A1    Nov. 5, 2015

Related U.S. Application Data

(63) Continuation of application No. 13/789,942, filed on Mar. 8, 2013, now Pat. No. 9,105,485.

(51) Int. Cl.
*H01L 23/48* (2006.01)
*H01L 23/00* (2006.01)
*H01L 25/065* (2006.01)

(52) U.S. Cl.
CPC .............. *H01L 24/09* (2013.01); *H01L 24/05* (2013.01); *H01L 24/06* (2013.01); *H01L 24/08* (2013.01); *H01L 24/80* (2013.01); *H01L 25/0657* (2013.01); *H01L 2224/02375* (2013.01); *H01L 2224/0401* (2013.01); *H01L 2224/05553* (2013.01); *H01L 2224/06133* (2013.01); *H01L 2224/06134* (2013.01); *H01L 2224/06135* (2013.01); *H01L 2224/08121* (2013.01); *H01L 2224/08147* (2013.01); *H01L 2224/0901* (2013.01); *H01L 2224/0903* (2013.01);

(Continued)

(58) Field of Classification Search
CPC ................ H01L 24/06; H01L 2924/14; H01L 2924/01079; H01L 2924/01013
USPC .................... 257/773, 765, 697, 737; 438/460
See application file for complete search history.

(56) References Cited

U.S. PATENT DOCUMENTS 4,930,001 A * 5/1990 Williams ................ H01L 24/13
216/108
5,074,947 A * 12/1991 Estes .................... H01L 23/4828
156/299

(Continued)

FOREIGN PATENT DOCUMENTS

TW        200707043        2/2007

*Primary Examiner* — Mohammed Shamsuzzaman
(74) *Attorney, Agent, or Firm* — Slater & Matsil, L.L.P.

(57) ABSTRACT

A package includes a package component and a second package component. A first elongated bond pad is at a surface of the first package component, wherein the first elongated bond pad has a first length in a first longitudinal direction, and a first width smaller than the first length. A second elongated bond pad is at a surface of the second package component. The second elongated bond pad is bonded to the first elongated bond pad. The second elongated bond pad has a second length in a second longitudinal direction, and a second width smaller than the second width. The second longitudinal direction is un-parallel to the first longitudinal direction.

20 Claims, 10 Drawing Sheets

(52) U.S. Cl.
   CPC . *H01L2224/131* (2013.01); *H01L 2224/16105* (2013.01); *H01L 2224/80203* (2013.01); *H01L 2224/80357* (2013.01); *H01L 2224/80895* (2013.01); *H01L 2224/80896* (2013.01); *H01L 2224/94* (2013.01); *H01L 2225/06527* (2013.01); *H01L 2924/01013* (2013.01); *H01L 2924/01079* (2013.01); *H01L 2924/14* (2013.01)

(56) References Cited

U.S. PATENT DOCUMENTS

| | | | | |
|---|---|---|---|---|
| 5,541,449 A | * | 7/1996 | Crane, Jr. | H01L 24/73 257/692 |
| 5,635,424 A | * | 6/1997 | Rostoker | G03F 7/70433 257/E23.02 |
| 5,767,580 A | * | 6/1998 | Rostoker | H01L 23/49811 257/737 |
| 5,773,889 A | * | 6/1998 | Love | H01L 21/486 257/737 |
| 6,541,867 B1 | * | 4/2003 | Fjelstad | H01L 21/4853 257/773 |
| 7,504,723 B2 | | 3/2009 | Peng et al. | |
| 7,626,276 B2 | * | 12/2009 | Hess | H01L 23/522 257/773 |
| 7,737,000 B2 | * | 6/2010 | Rommeveaux | B81C 1/0023 257/E21.122 |
| 2005/0003664 A1 | * | 1/2005 | Ramanathan | H01L 24/11 438/689 |
| 2008/0054425 A1 | * | 3/2008 | Malhan | H01L 24/72 257/678 |
| 2009/0272714 A1 | * | 11/2009 | Weste | H01L 23/48 216/13 |
| 2010/0096760 A1 | * | 4/2010 | Yu | H01L 24/05 257/774 |
| 2012/0217044 A1 | * | 8/2012 | Koduri | H01L 23/49541 174/252 |
| 2012/0252189 A1 | * | 10/2012 | Sadaka | H01L 24/05 438/455 |
| 2013/0068929 A1 | | 3/2013 | Solhusvik et al. | |
| 2013/0092960 A1 | * | 4/2013 | Wilcox | H01L 33/08 257/88 |
| 2013/0328204 A1 | * | 12/2013 | Zommer | B23K 1/20 257/765 |

\* cited by examiner

BONDING STRUCTURES AND METHODS OF FORMING THE SAME

PRIORITY CLAIM AND CROSS-REFERENCE

This application is a continuation of U.S. patent application Ser. No. 13/789,942, entitled "Bonding Structures and Methods of Forming the Same," filed on Mar. 8, 2013, which application is incorporated herein by reference.

BACKGROUND

Metal-to-metal bonding (also sometimes referred to as direct bonding) is a commonly used bonding method in the packaging of integrated circuits. In the direct bonding, the bond pads of two wafers or chips are bonded together without solder disposed in between. For example, the direct bonding may be a copper-to-copper bonding or a gold-to-gold bonding. The methods for performing the direct bonding include Thermal Compression Bonding (TCB, sometimes known as thermal compressive bonding). In a typical direct bonding process, the metal bumps of a device die are aligned to, and are placed against, the metal bumps of a package substrate. A pressure is applied to press the device die and the package substrate against each other. During the bonding process, the device die and the package substrate are also heated. With the pressure and the elevated temperature, the surface portions of the metal bumps of the device die and the package substrate inter-diffuse, so that bonds are formed.

The direct bonding typically requires large metal pads. The large metal pads, however, may incur severe dishing problem in the planarization of the metal pads. Furthermore, Misalignment between the two bonded package components may occur, and hence the contact area of the bonds may vary depending on the severity of the misalignment. The variation of the contact area results in the variation of the contact resistance, which in turn results in the variation in the performance of the resulting package. When the metal-to-metal bonding is used to bond integrated circuits that have high bond densities, due to the small sizes and the small pitches of the bond pads, the variation in the contact resistance is worsened.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A bond structure is provided in accordance with various exemplary embodiments. The variations of the embodiments are discussed. Throughout the various views and illustrative embodiments, like reference numbers are used to designate like elements.

Figure 1:
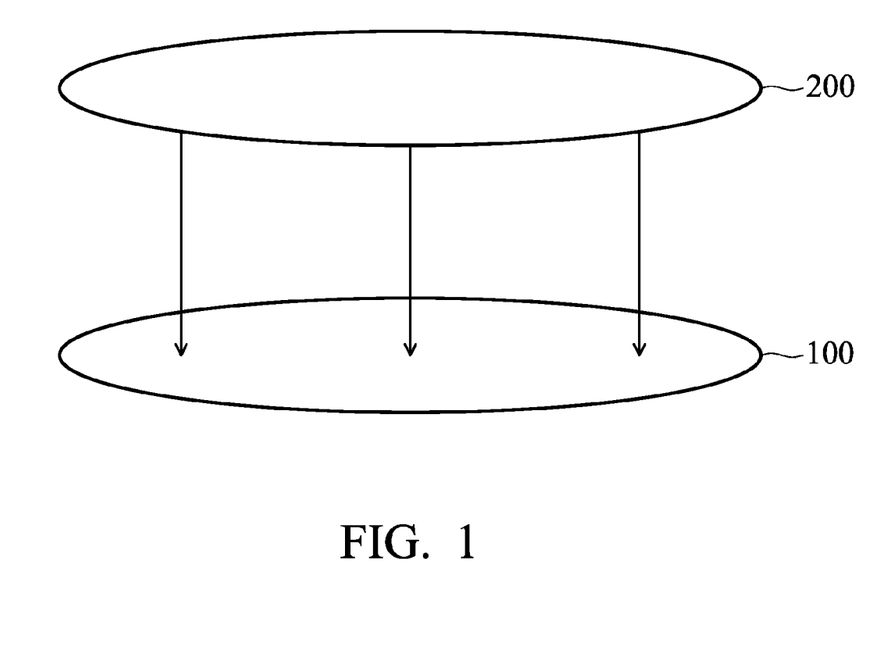
FIG. 1 schematically illustrates the bonding of two package components in accordance with exemplary embodiments, wherein the bonding is performed through metal-to-metal bonding.

Referring to FIG. 1, package component 200 is bonded to package component 100 through metal-to-metal bonding, for example, which is also referred to as direct bonding. In alternative embodiments, other bonding mechanisms such as solder bonding can be used. In the bonding process, elongated bond pads 108 (FIGS. 2 through 10) on the surface of package component 100 are in physical contact with, and are bonded to, the elongated bond pads 208 (FIGS. 2 through 10) of package component 200 directly, wherein no solder is applied between elongated bond pads 108 and their corresponding elongated bond pads 208. During the bonding process, package components 100 and 200 may be heated, and a pressure may be applied to press package components 100 and 200 against each other. With the pressure and the elevated temperature, the surface portions of bond pads 108 and 208 inter-diffuse, so that bonds are formed.

In accordance with some embodiments, each of package components 100 and 200 may be a device wafer, an interposer wafer, a package substrate strip, or the like. In the embodiments wherein package components 100 and 200 are device wafers, package components 100 and 200 may be logic circuit wafers, memory wafers, Complementary Metal-Oxide-Semiconductor (CMOS) Image Sensor (CIS) wafers, or the like. For example, in the embodiments wherein package components 100 and 200 are memory wafers, package components 100 and 200, after bonded, form stacked memories. In the embodiments wherein package components 100 and 200 are CIS wafers, package components 100 and 200, after bonded, form 3D-CIS packages. In the embodiments wherein package components 100 and 200 are interposer wafers, package components 100 and 200 are free from active devices such as transistors therein, and are used to route electrical connections from one side of the interposer wafer to the opposite side. In the embodiments wherein package components 100 and 200 are package substrate strips, package components 100 and 200 may include a plurality of package substrates, and may include build-up substrates (with cores) or laminate substrates. Although FIG. 1 illustrates that package components 100 and 200 have round top-view shapes, they may also have rectangular top-view shapes. Furthermore, in some embodiments, each of package components 100 and 200 may include a plurality of chips therein. Alternatively, each of package components 100 and 200 may be a discrete device die, a discrete package substrate, a discrete interposer die, or the like, which have already been sawed from the respective wafer or strip at the time it is bonded.

Figure 2:
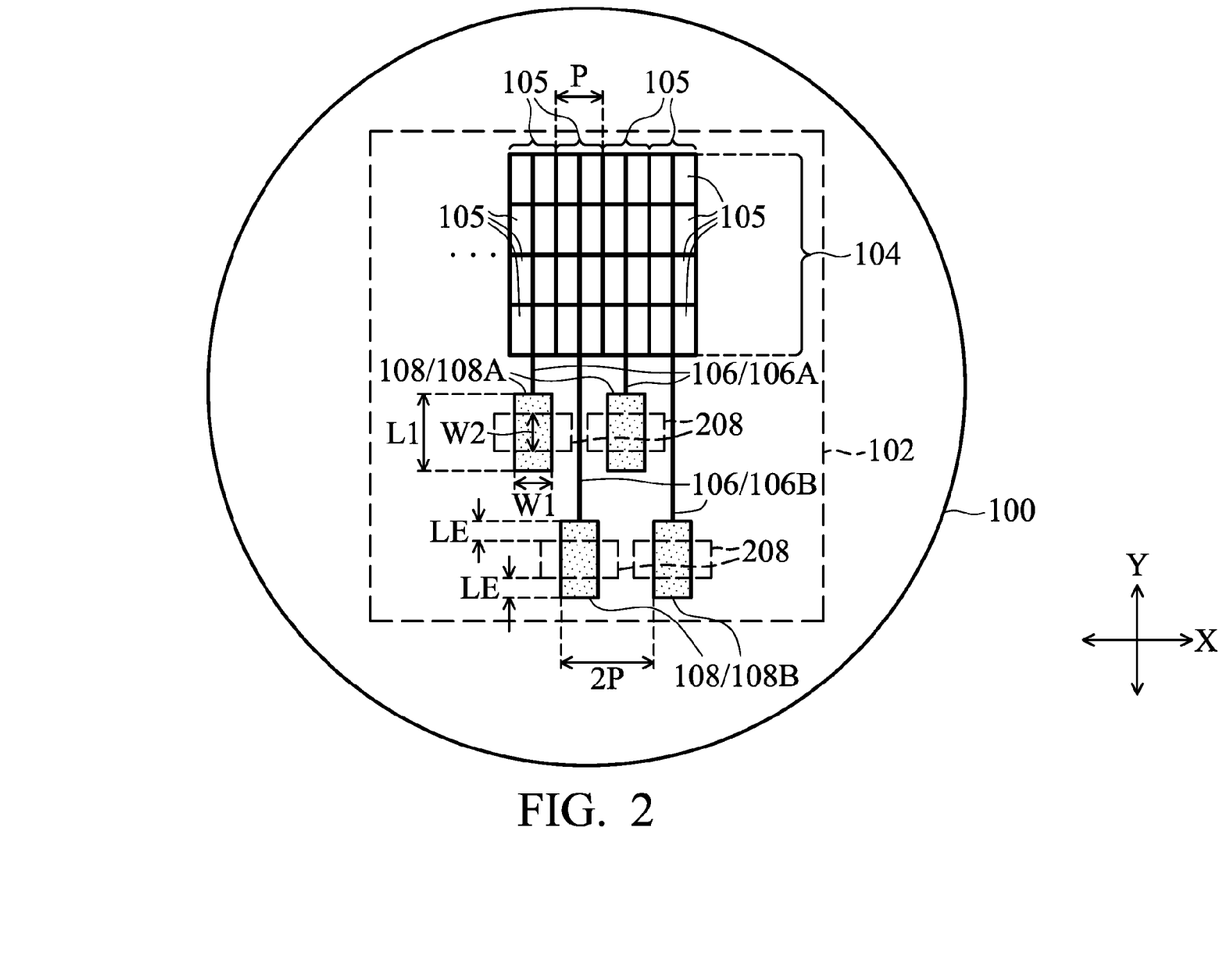
FIG. 2 illustrates a top view of the bond pads at a surface of a first package component in accordance with exemplary embodiments, wherein bond pads are laid out with a staggered layout, and are located on one side of an array.

FIG. 2 illustrates a top view of package component 100, and the components in package component 100. In the embodiments package component is a wafer, package component 100 may include a plurality of dies (with one die 102 illustrated) identical to each other. In the present disclosure, image sensor arrays 104 and the corresponding connection lines 106 and elongated bond pads 108 are used as examples to explain the concept of the embodiments. It is appreciated that the teaching of the embodiments also applies to all other types of circuits such as memory arrays, logic circuits, and the like.

In some exemplary embodiments, package component 100 includes image sensor array 104, which includes a plurality of image sensors (cells) 105 arranged as a plurality of rows and columns. In some embodiments, image sensors 105 in each of the columns are connected to one of connection lines 106 (including 106A and 106B). Each of connection lines 106 may be connected to one of elongated bond pads 108, which include 108A and 108B. Connection lines 106 may be in a same metal layer as, and formed simultaneously as, bond pads 108. Alternatively, connection lines 106 may be in a different metal layer than bond pads 108. Elongated bond pads 108 are located at a surface of package component 100. The pitch of the columns is denoted as P.

Elongated bond pads 108 have length L1 and width W1 smaller than length L1. In some embodiments, elongated bond pads 108 have a top-view shape of rectangles, which may have substantially sharp corners or rounded corners. Elongated bond pads 108 on the manufactured dies or wafers may have rounded corners due to optical effects. The elongated bond pads 108 with rounded corners, however, may still include a middle section that includes a majority of the respective bond pads, wherein the middle section has a uniform width W1. Ratio L1/W1 may be greater than 2 or greater than 3, although smaller ratios may also be used. Ratio L1/W1 may also be between about 2 and about 4. In the illustrated embodiments, the longitudinal directions of elongated bond pads 108 are parallel to the column direction (the Y direction). In alternative embodiments, the longitudinal directions of elongated bond pads 108 may also be parallel to the row direction (the X direction).

In accordance with some embodiments, the layout of elongated bond pads 108 and connection lines 106 have a staggered design, for example, with elongated bond pads 108A aligned as a first row extending in the X direction, and elongated bond pads 108B aligned as a second row parallel to the first row. The connection lines 106A that are connected to elongated bond pads 108A are shorter than connection lines 106B that are connected to elongated bond pads 108B. Furthermore, connection lines 106A and connection lines 106B are allocated with an alternating layout. Through this design, elongated bond pads 108A may have their pitches equal to 2 P, and elongated bond pads 108B may also have their pitches equal to 2 P. Through the staggered layout design, elongated bond pads 108 are suitable to be used to connect to array 104 that has a smaller pitch, which may be a half of the pitch of elongated bond pads 108A (or 108B). Although not shown, in alternative embodiments, all elongated bond pads 108 may also be aligned as one row, and hence the pitches of elongated bond pads 108 are also equal to pitch P. The respective design may be used when pitch P is great enough for accommodating elongated bond pads 108 and 208.

Figure 3:
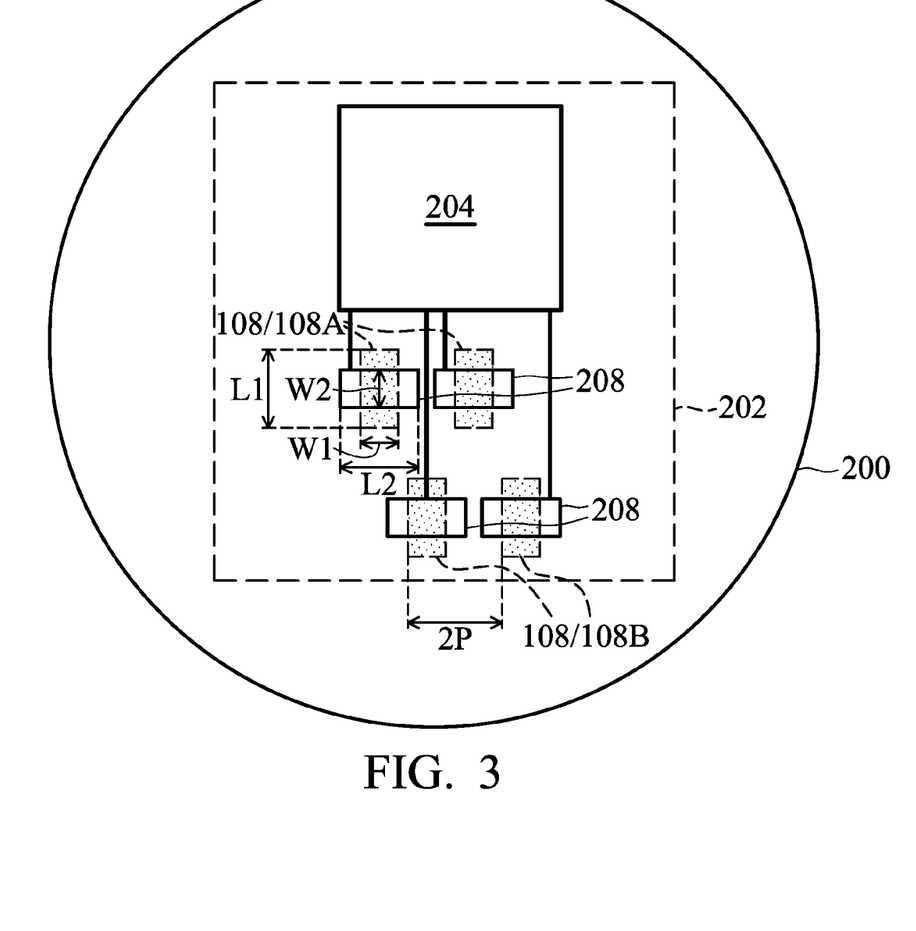
FIG. 3 illustrates a top view of the bond pads at a surface of a second package component, wherein the bond pads of the second package component are to be bonded to the bond pads of the first package component shown in FIG. 2.

FIG. 2 also illustrates elongated bond pads 208 that are bonded to elongated bond pads 108. Throughout the description, a bond pad 108 and the bond pad 208 bonded to the bond pad 108 in combination are referred to as a bonded pair. Elongated bond pads 208 are shown using dashed lines since they are located in package component 200, whose top view is shown in FIG. 3. Referring to FIG. 3, elongated bond pads 208 are located at a surface of package component 200, and are bonded to elongated bond pads 108, for example, through metal-to-metal bonding, although other bonding methods such as solder bonding may be used. In the embodiments wherein the solder bonding is performed, a solder layer may be formed on each or one of elongated bond pads 108 and 208 that are in the same bonded pair. Elongated bond pads 208 have length L2 and width W2 smaller than length L2. In some embodiments, length L2 is equal to length L1 of elongated bond pads 108. In alternative embodiments, length L2 is greater than or smaller than length L1. Furthermore, width W2 is equal to width W1 of elongated bond pads 108 in some embodiments. In alternative embodiments, width W2 is greater than or smaller than width W1. In some exemplary embodiments, package component 200 includes circuit 204, and connection lines 206 electrically coupling elongated bond pads 208 to circuit 204. In alternative embodiments, connection lines 206 route the connection to an opposite surface of package component 200, which opposite surface is opposite to the surface that package component 100 is bonded to. In the respective embodiments, package component 200 may include an interposer or a package substrate, although package component may also be a device die/wafer including through vias. Elongated bond pads 108 are also illustrated in FIG. 3, and are shown using dashed lines since they are located in package component 100.

In FIGS. 2 and 3, the longitudinal directions of elongated bond pads 108 are un-parallel to the longitudinal directions of elongated bond pads 208. In some embodiments, the longitudinal directions of elongated bond pads 108 are perpendicular to the longitudinal directions of elongated bond pads 208. Hence, when bonded, the contact area between bond pads 108 and 208 in the same bonded pair is equal to W1×W2. In the bonding process, misalignment between package components 100 and 200 may occur, and the centers of elongated bond pads 108 may be misaligned with the centers of the corresponding elongated bond pads 208. Advantageously, with the elongated design, even if the misalign occurs, the contact area may still remain to be W1×W2. The contact resistance thus remains constant regardless of whether the misalignment occurs or not, and regardless of the magnitude of the misalignment. To ensure that the contact area remains to be W1×W2, the lengths L1 and L2 are selected so that the extended length LE on each side of the intended contact area (the center regions of 108 and 208) is greater than or equal to the maximum alignment of the alignment tool and the alignment process. Alternatively stated, with the extend LE added to each side of the intended contact area, even if the misalignment is maximized in a successful alignment operation, the contact area will still be W1×W2.

In the embodiments wherein each of package components 100 and 200 includes a plurality of dies, after the bonding process, the bonded structure may be sawed into a plurality of packages, with each of the packages including one of dies 102 (FIG. 2) and 202 (FIG. 3).

FIGS. 4 through 9 illustrate package components 100 and 200 in accordance with alternative embodiments. Unless specified otherwise, the layout and the shape of the components in these embodiments are essentially the same as the like components, which are denoted by like reference numerals in the embodiments shown in FIGS. 2 and 3. The details regarding the components shown in FIGS. 4 through 9 may thus be found in the discussion of the embodiment shown in FIGS. 2 through 3.

Figure 4:
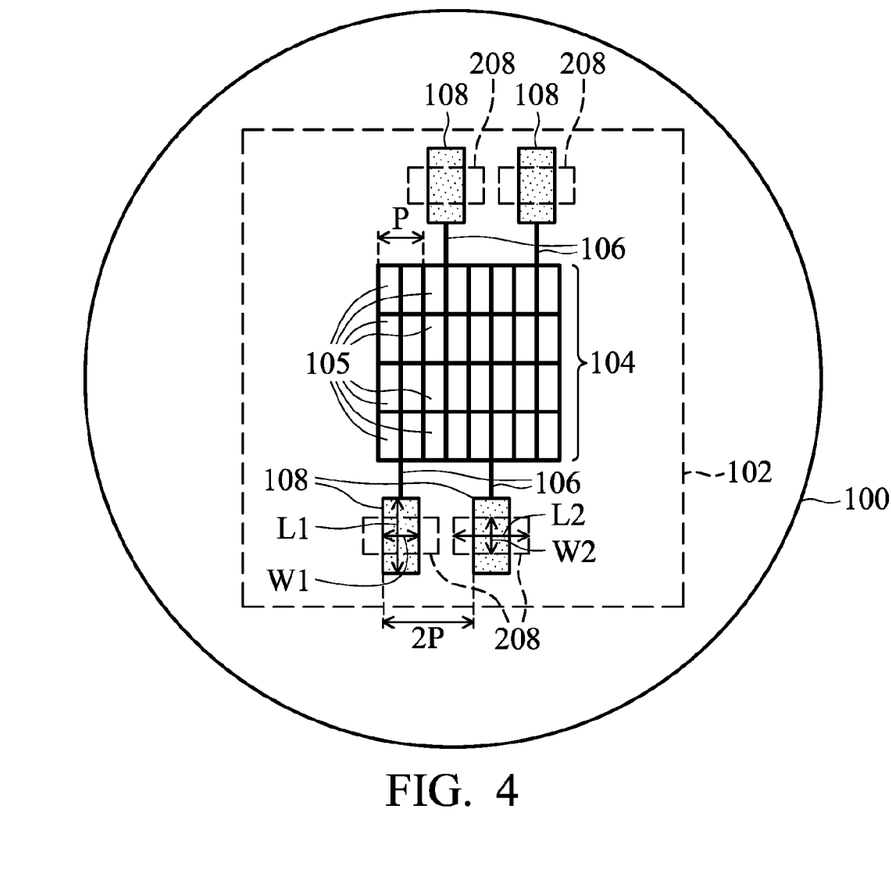
FIG. 4 illustrates a top view of the bond pads at a surface of a first package component in accordance with alternative exemplary embodiments, wherein the bond pads are located on opposite sides of an array.

FIG. 4 illustrates a top view of package component 100 in accordance with alternative embodiments. These embodiments are similar to the embodiments in FIG. 2, except that elongated bond pads 108 are distributed on the opposite sides of array 104. Accordingly, the pitch between neighboring elongated bond pads 108 is also equal to 2 P. One advantageous feature of this layout is that all connection lines 106 may have the same length, and hence the same resistance. Elongated bond pads 208 are shown in FIG. 4 using dashed lines since they are located in package component 100.

Figure 5:
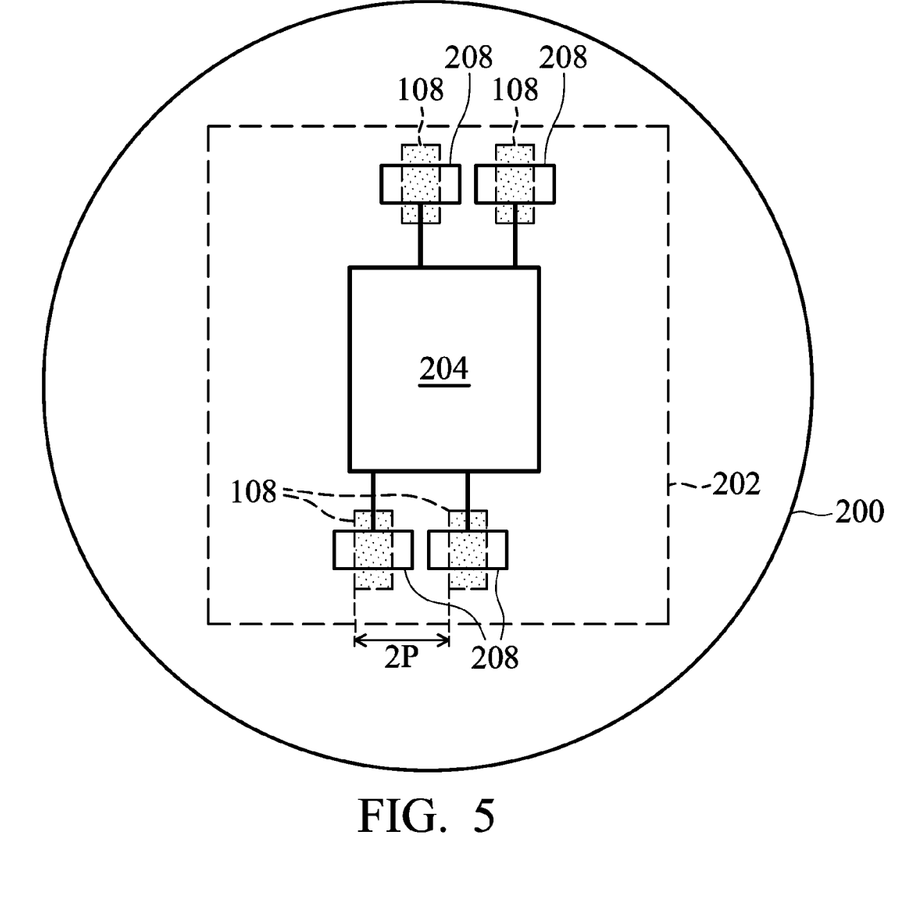
FIG. 5 illustrates a top view of the bond pads at a surface of a second package component, wherein the bond pads of the second package component are to be bonded to the bond pads of the first package component in FIG. 4.

FIG. 5 illustrates a top view of package component 200 in accordance with some exemplary embodiments, wherein package component 200 is bonded to package component 100 in FIG. 4. Elongated bond pads 208 are bonded to bond pads 108 with a one-to-one correspondence. Again, the longitudinal directions of bond pads 108 may be un-parallel to, and may be perpendicular to, the longitudinal directions of the corresponding bond pads 208. Elongated bond pads 108 are shown in FIG. 5 using dashed lines since they are located in package component 200.

Figure 6:
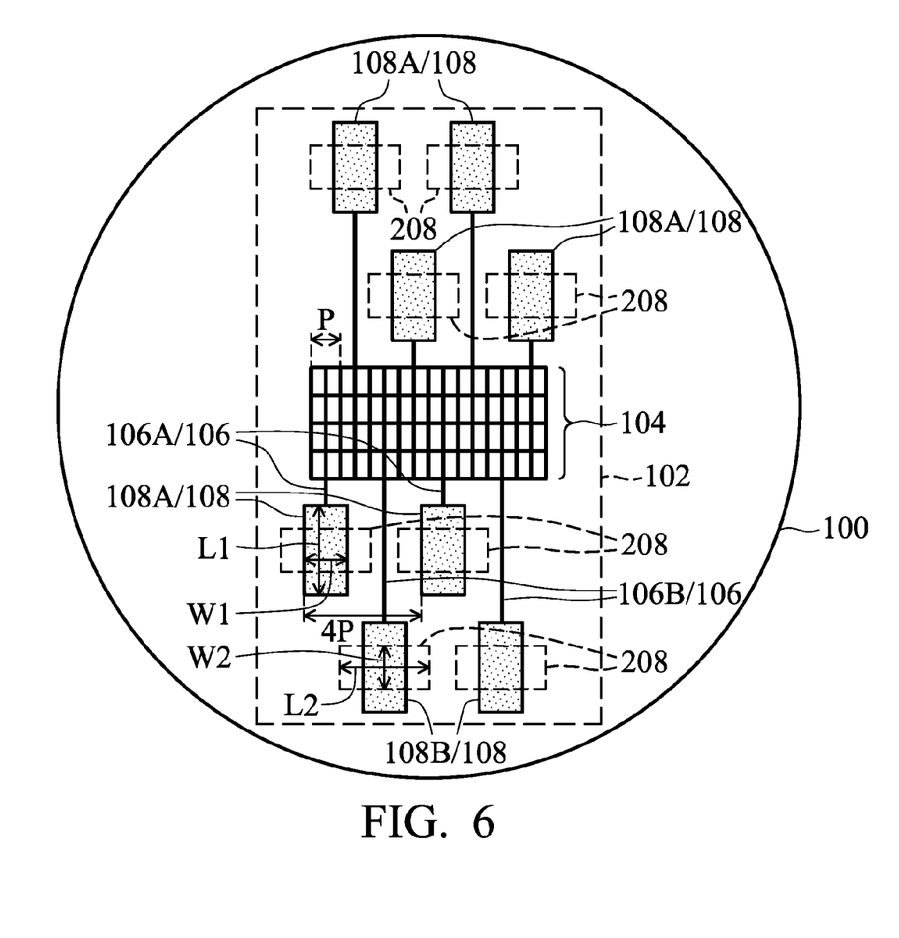
FIG. 6 illustrates a top view of the bond pads at a surface of a first package component in accordance with yet alternative exemplary embodiments, wherein the bond pads are staggered, and are located on opposite sides of an array.

FIG. 6 illustrates a top view of package component 100 in accordance with yet alternative embodiments. These embodiments are similar to the embodiments in FIGS. 2 and 3, except that elongated bond pads 108 are distributed on the opposite sides of array 104. Furthermore, on each side of array 104, elongated bond pads 108 have a staggered layout. On each side of array 104, connection lines 106A and 106B may thus have different lengths, and bond pads 108A and bond pads 108B may be aligned as different rows that are parallel to each other. The pitch between neighboring elongated bond pads 108 in accordance with these embodiments is increased to 4 P.

Figure 7:
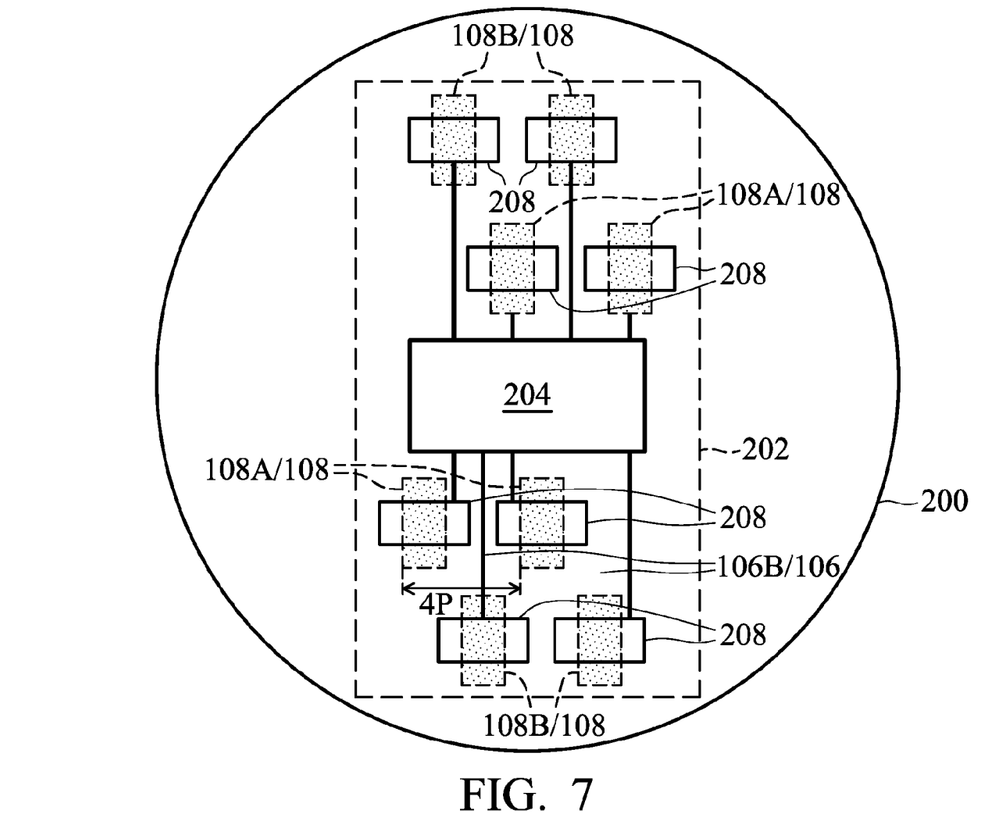
FIG. 7 illustrates a top view of the bond pads at a surface of a second package component, wherein the bond pads of the second package component are to be bonded to the bond pads of the first package component in FIG. 6.

FIG. 7 illustrates a top view of package component 200 in accordance with some exemplary embodiments, wherein package component 200 is bonded to package component 100 in FIG. 6. Bond pads 208 are bonded to bond pads 108 with a one-to-one correspondence. Again, the longitudinal directions of bond pads 108 may be un-parallel to, and may be perpendicular to, the longitudinal directions of the corresponding bond pads 208. Elongated bond pads 108A and 108B are shown in FIG. 7 using dashed lines since they are located in package component 200.

Figure 8:
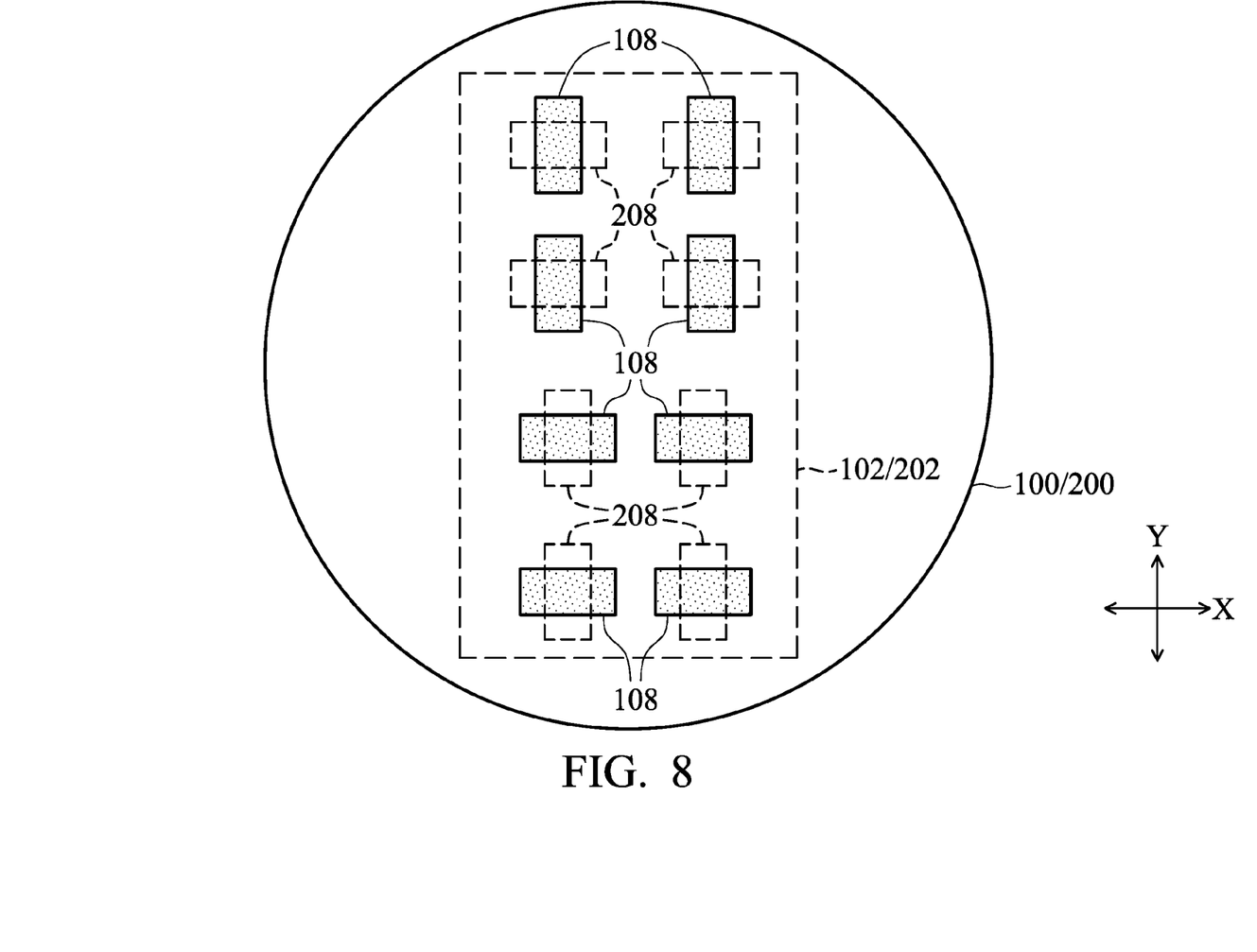
FIG. 8 illustrates a top view of bond pads in accordance with some exemplary embodiments, wherein elongated bonds pads of a same wafer or chip have longitudinal directions un-parallel to each other.

FIG. 8 illustrates that elongated bond pads 108 in a same chip (and/or a same wafer) may have a plurality of longitudinal directions that is not parallel to each other. In accordance with some embodiments, as shown in FIG. 8, some of elongated bond pads 108 have longitudinal directions in the X direction, and some other elongated bond pads 108 have longitudinal directions in the Y direction. The longitudinal directions of elongated bond pads 208 are designed to be un-parallel to the longitudinal directions of the respective connecting elongated bond pads 108. Being able to allocate the longitudinal directions of elongated bond pads 108 in different directions provides a flexible design for allocating the bond pads, so that the usage of chip area may be maximized.

Figure 9:
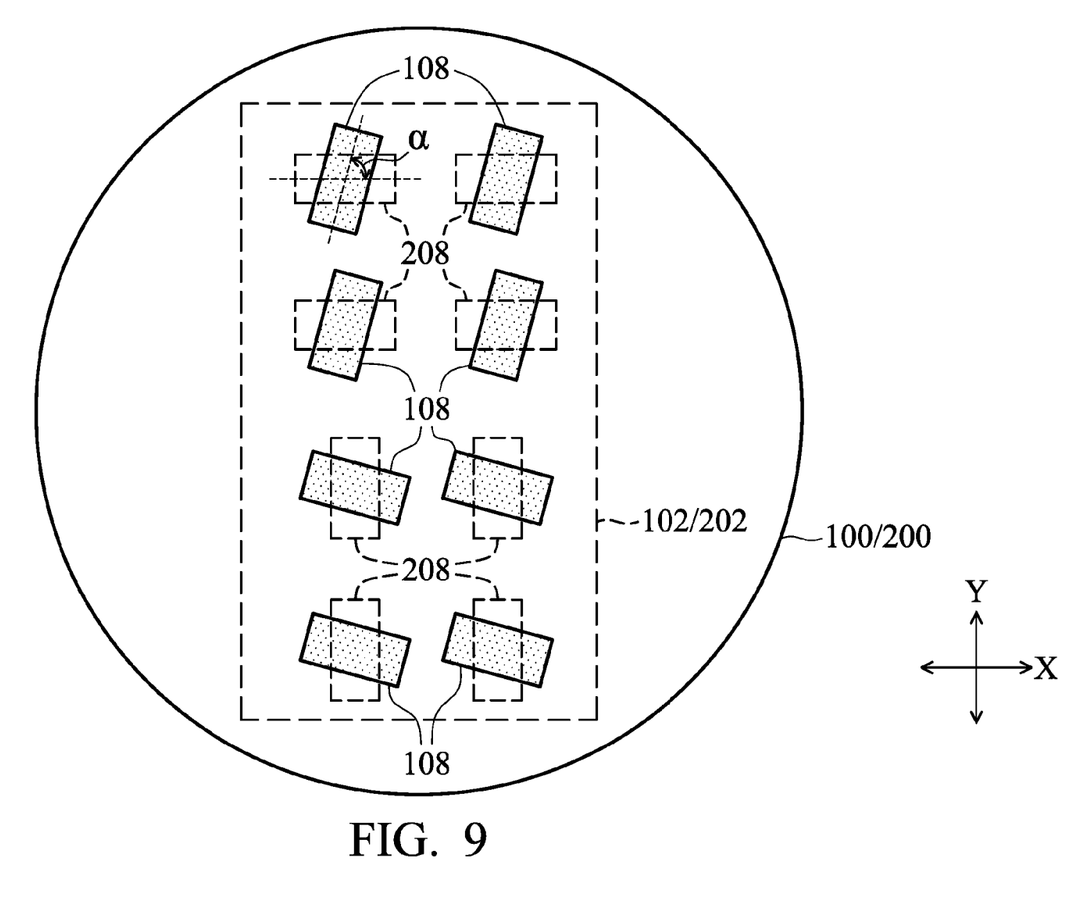
FIG. 9 illustrates a top view of bond pads in accordance with some exemplary embodiments, wherein bonds pads in same bonded pairs have longitudinal directions neither perpendicular to each other nor parallel to each other.

FIG. 9 illustrates that elongated bond pads 108 and 208 in the same bonded pair have longitudinal directions un-perpendicular to each other, and un-parallel to each other. Angle α between the longitudinal directions of elongated bond pads 108 and 208 may be between about 30 degrees and 90 degrees. Again, in these embodiments, elongated bond pads 108 in the same die or wafer may have a plurality of longitudinal directions that are not parallel to each other, and elongated bond pads 208 in the same die or wafer may have a plurality of longitudinal directions that are not parallel to each other.

Figure 10:
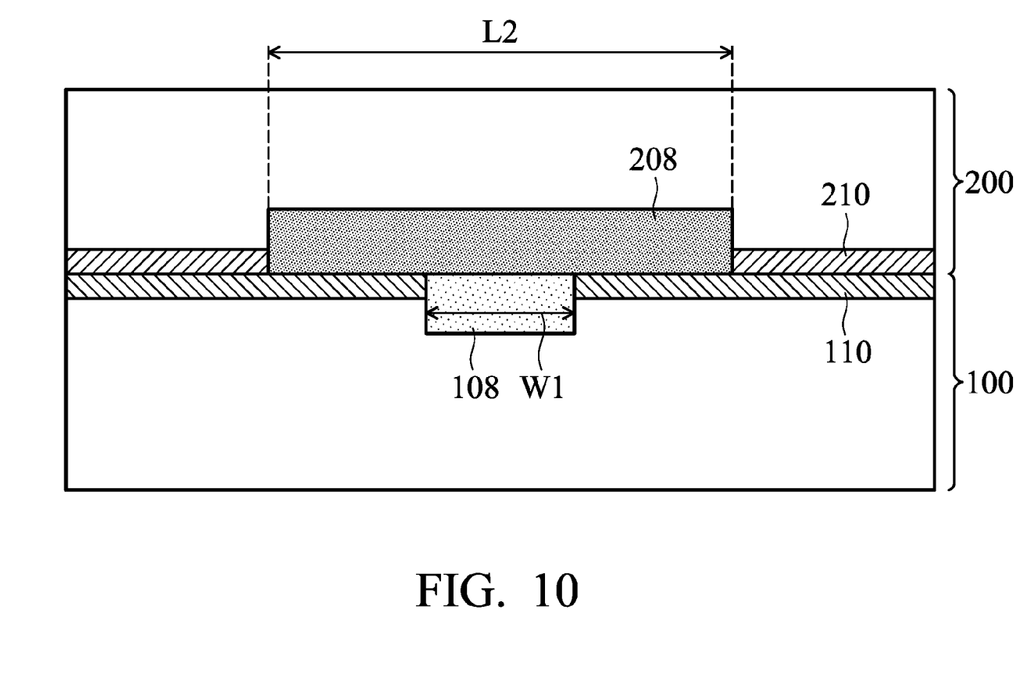
FIG. 10 illustrates a cross-sectional view of two bond pads that are bonded to each other.

FIG. 10 illustrates a cross-sectional view of a bonded pair including one bond pad 108 and one bond pad 208, which are bonded to each other. The cross-sectional view may be obtained from any of FIGS. 1 through 9. In some embodiments, dielectric diffusion barriers 110 and 210 are formed on the top surfaces of package components 100 and 200, respectively, and are used to prevent the materials (such as copper) in elongated bond pads 108 and 208 to diffuse to the other package component. Diffusion barriers 110 and 210 may include nitrides, oxynitrides, or the like. In some embodiments, diffusion barriers 110 and 210 may also be bonded to each other, for example, through fusion bonding. The surface of bond pad 208 facing package component 100 includes a first portion(s) in contact with a surface of dielectric barrier 110, and a second portion in contact with and bond to a surface of bond pad 108. Similarly, a surface of bond pad 108 facing package component 200 includes a first portion(s) in contact with a surface of dielectric barrier 210, and a second portion in contact with and bond to a surface of bond pad 208.

In the embodiments of the present disclosure, the widths of bond pads are reduced, resulting in the reduction of the areas of the bond pads. Accordingly, the dishing effect in the planarization of the bond pads is alleviated, and the bond quality may be improved. Furthermore, with the elongated design of the bond pads and the un-parallel allocation of the bond pads in the same bond pairs, the contact area of the bonds may remain unchanged even if misalignment occurs.

In accordance with some embodiments, a package includes a package component and a second package component. A first elongated bond pad is at a surface of the first package component, wherein the first elongated bond pad has a first length in a first longitudinal direction, and a first width smaller than the first length. A second elongated bond pad is at a surface of the second package component. The second elongated bond pad is bonded to the first elongated bond pad. The second elongated bond pad has a second length in a second longitudinal direction, and a second width smaller than the second width. The second longitudinal direction is un-parallel to the first longitudinal direction. A ratio of the first length to the first width may be greater than about 2.

In accordance with other embodiments, a package includes a die, which includes an array of cells, and a first plurality of elongated bond pads at a surface of the die. Each of the first plurality of elongated bond pads is electrically coupled to one column of the cells in the array. The first plurality of elongated bond pads has first longitudinal directions parallel to each other. The package further includes a package component, which includes a second plurality of elongated bond pads at a surface of the package component. Each of the second plurality of elongated bond pads is bonded to one of the first plurality of elongated bond pads. The second plurality of elongated bond pads has second longitudinal directions parallel to each other, wherein the second longitudinal directions is un-parallel to the first longitudinal directions.

In accordance with yet other embodiments, a package includes a first die and a first bond pad at a surface of the first die, wherein the first bond pad has a substantially rectangular top-view shape. The rectangular top-view shape has a first length extending in a first direction, and a first width smaller than the first length. The package further includes a second die bonded to the first die, and a second bond pad at a surface of the second die and bonded to the first bond pad. The second bond pad has a second length extending in a second direction perpendicular to the first direction, and a second width smaller than the second length. A ratio of the first length to the first width may be greater than about 2.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
    a first package component comprising:
        a first bond pad at a surface of the first package component, wherein the first bond pad has a first length and a first width smaller than the first length, and the first width is measured in a width direction, wherein the first bond pad comprises a first middle portion, and two end portions on opposite sides of the first middle portion, with interfaces between the first middle portion and the two end portions being along the width direction; and
    a second package component comprising:
        a second bond pad at a surface of the second package component, wherein the second bond pad is bonded to the first middle portion of the first bond pad, with the first middle portion physically contacting the second bond pad, and the two end portions of the first bond pads are not directly bonded to the second bond pad, wherein the first and the second bond pads have a contact area comprising:
    a first and a second side aligned to a first and a second long edge, respectively, of the first bond pad; and
    a third and a fourth side aligned to a first and a second long edge, respectively, of the second bond pad, wherein each of the first and second bond pads has an extended portion on at least one side of the contact area.

2. The package of claim 1, wherein the second package component further comprises a dielectric layer, and wherein the two end portions of the first bond pad are both in contact with the dielectric layer.

3. The package of claim 1, wherein the second bond pad further comprises:
    a second middle portion bonded to the first middle portion; and
    two additional end portions on opposite sides of the second middle portion, wherein the two additional end portions of the second bond pad are not directly bonded to the first bond pad.

4. The package of claim 3, wherein the first package component further comprises an additional dielectric layer, and the two additional end portions of the second bond pad are both in contact with the additional dielectric layer.

5. The package of claim 1, wherein the second bond pad is elongated with a second length and a second width smaller than the second length.

6. The package of claim 5, wherein the first length of the first bond pad is in a first lengthwise direction, and the second length of the second bond pad is in a second lengthwise direction un-parallel to the first lengthwise direction.

7. A package comprising:
    a first package component comprising:
        a first dielectric layer; and
        a first bond pad in the first dielectric layer, wherein the first bond pad comprises a first middle portion, and two first end portions on opposite sides of the first middle portion; and
    a second package component comprising:
        a second dielectric layer; and
        a second bond pad in the second dielectric layer, wherein the second bond pad comprises a second middle portion, and two second end portions on opposite sides of the second middle portion, and wherein the first middle portion is bonded to the second middle portion, the two first end portions are in contact with the second dielectric layer, and the two second end portions are in contact with the first dielectric layer, wherein the first and the second bond pads have a contact area comprising:
    a first and a second side aligned to a first and a second long edge, respectively, of the first bond pad; and
    a third and a fourth side aligned to a first and a second long edge, respectively, of the second bond pad, wherein each of the first and second bond pads has an extended portion on at least one side of the contact area.

8. The package of claim 7, wherein the first dielectric layer is bonded to the second dielectric layer through fusion bonding.

9. The package of claim 7, wherein the first bond pad and the second bond pad form a bonded pair, and the package further comprises a first and a second plurality of bonded pairs having structures identical to a structure of the bonded pair, and wherein the first and the second plurality of bonded pairs form a staggered layout.

10. The package of claim 9, wherein the first package component comprises an image sensor array, and wherein the first plurality of bonded pairs is connected to a first plurality of columns of the image sensor array, and the second plurality of bonded pairs is connected to a second plurality of columns of the image sensor array, and the first and the second plurality of columns of the image sensor array are allocated in an alternating layout.

11. The package of claim 7, wherein the first bond pad is elongated with a first length and a first width smaller than the first length, and the second bond pad is elongated with a second length and a second width smaller than the second length.

12. The package of claim 11, wherein the first length is in a first lengthwise direction, the second length is in a second lengthwise direction, with both the first lengthwise direction and the second lengthwise direction parallel to an interface between the first package component and the second package component, and wherein the first lengthwise direction is un-parallel to the second lengthwise direction.

13. The package of claim 12, wherein the first lengthwise direction is perpendicular to the second lengthwise direction.

14. The package of claim 12, wherein the first lengthwise direction is neither parallel nor perpendicular to the second lengthwise direction.

15. A package comprising:
a first device die comprising:
an image sensor array comprising a plurality of columns of image sensors;
a plurality of connection lines, each connected to one of the plurality of columns; and
a first plurality of bond pads, each connected to one of the plurality of connection lines, wherein the first plurality of bond pads has first lengthwise directions parallel to a first direction, wherein the first plurality of bond pads comprises a first bond pad; and
a second device die bonded to the first device die, with an interface formed between the first device die and the second device die, wherein the second device die comprises:
a second plurality of bond pads having second lengthwise directions, wherein both the first lengthwise directions and the second lengthwise directions are parallel to the interface, and the first lengthwise directions are un-parallel to the second lengthwise directions, wherein the first plurality of bond pad is bonded to the second plurality of bond pads to form a plurality of bonded pairs, with each of the plurality of bonded pairs comprising a first bond pad bonded to a second bond pad to have a contact area comprising
a first and a second side aligned to a first and a second long edge, respectively, of the first bond pad; and
a third and a fourth side aligned to a first and a second long edge, respectively, of the second bond pad, wherein each of the first and second bond pads has an extended portion on at least one side of the contact area.

16. The package of claim 15, wherein each of the first plurality of bond pads comprises:
a middle portion bonded to a respective one of the second plurality of bond pads, and two end portions on opposite sides of the middle portion, wherein the two end portions are not bonded to the respective one of the second plurality of bond pads.

17. The package of claim 16, wherein the first device die further comprises a dielectric layer, and the two end portions are in contact with the dielectric layer.

18. The package of claim 15, wherein the first plurality of bond pads is allocated into two staggered rows.

19. The package of claim 15, wherein the first lengthwise directions are parallel to the plurality of connection lines.

20. The package of claim 6, wherein the first lengthwise direction and the second lengthwise direction are perpendicular to each other.

* * * * *